United States Patent [19]
Taylor et al.

[11] Patent Number: 5,594,204
[45] Date of Patent: Jan. 14, 1997

[54] OVERMOLDED PC BOARD WITH ESD PROTECTION AND EMI SUPPRESSION

[75] Inventors: Carl J. Taylor, Morgan Hill; Michael W. Patterson, Pleasanton; Gordon Force, San Jose, all of Calif.

[73] Assignee: National Semiconductor Corporation, Santa Clara, Calif.

[21] Appl. No.: 506,886

[22] Filed: Jul. 25, 1995

Related U.S. Application Data

[63] Continuation-in-part of Ser. No. 406,450, Mar. 20, 1995.
[51] Int. Cl.⁶ .................................................. H01L 23/28
[52] U.S. Cl. .................. 174/52.2; 361/737; 361/818; 257/787; 257/788; 257/790; 257/789
[58] Field of Search .................. 174/52.1–52.4; 257/787–790, 795; 361/737–739, 749, 760, 816, 820, 818

[56] References Cited

U.S. PATENT DOCUMENTS

| | | | |
|---|---|---|---|
| 5,377,060 | 12/1994 | Nigam | 360/99.01 |
| 5,389,739 | 2/1995 | Mills | 174/52.4 |
| 5,390,082 | 2/1995 | Chase et al. | 361/783 |
| 5,406,117 | 4/1995 | Dlugokecki et al. | 257/659 |
| 5,416,358 | 5/1995 | Ochi et al. | 257/675 |
| 5,438,224 | 8/1995 | Papageorge et al. | 257/777 |
| 5,461,545 | 10/1995 | Leroy et al. | 361/765 |

*Primary Examiner*—Bot L. Ledynh
*Attorney, Agent, or Firm*—Skjerven, Morrill, MacPherson, Franklin & Friel; Paul J. Winters

[57] ABSTRACT

An apparatus directed to portable peripheral cards is disclosed which provide protection against electro-static discharge and electro-magnetic interference. Furthermore, this apparatus provides a solid housing which affords a strong protective structure for the PC board and also protects the ICs housed inside the peripheral card from being easily accessed.

14 Claims, 3 Drawing Sheets

OVERMOLDED PC BOARD WITH ESD PROTECTION AND EMI SUPPRESSION

CROSS REFERENCE TO RELATED APPLICATIONS

This application is a continuation-in-part of the application entitled "Overmolded PC Board with ESD Protection and EMI Suppression" filed Mar. 20, 1995, invented by Carl J. Taylor and Michael W. Patterson, Ser. No. 08/406,450.

This application is related to the application entitled "Removable Computer Peripheral Cards Having a Solid One-piece Housing and Method of Manufacturing the Same", filing date Jul. 15, 1994, invented by Hem P. Takiar and Michael W. Patterson, Ser. No. 08/275985.

BACKGROUND OF THE INVENTION

1. Field of the Invention

The present invention relates in general to the packaging of electronic assemblies. More particularly, it is directed to the manufacture of peripheral cards such as PCMCIA cards having overmolded housing and protection against both electro-static discharge (ESD) and electro-magnetic interference (EMI).

2. Description of the Related Art

The technological progress in personal computers has led to high demand for expansion boards to enhance their functions. Originally, these boards were unprotected printed circuit boards (PC boards) having edge connectors and carrying a variety of circuit components soldered thereto. These boards were installed inside the computer and therefore required the opening of the case of the computer. However, the advent of the laptop personal computers along with the rapid progress in miniaturization of integrated circuits have brought about the development of the portable peripheral card. A particular type of peripheral card known as PCMCIA card has emerged as the industry standard. Many of the current laptop and notebook computers contain built-in support for PCMCIA cards. PCMCIA cards are inserted in external slots of a laptop or notebook computer without the inconvenience of opening the computer.

Even though originally developed for memory expansion cards (the acronym "PCMCIA" stands for "Personal Computer Memory Card International Association"), the PCMCIA standard has since seen wide adoption in a variety of applications, such as FLASH memory cards, hard disks, FAX/modem, security cards, etc. In many of the applications, such as security cards where the card is carried with the card holder in much the same way as a credit card, susceptibility to ESD is of primary concern. Furthermore, as these peripheral cards are packed in with more complex circuitries, adequate shielding against EMI also becomes of great importance.

Electro-static charge may build-up on any surface area of a peripheral card. If this charge is not properly discharged, it can cause damage to both the electronic components inside the card and the computer to which the card is coupled. Therefore, an effective discharge path is needed from any surface area of the card.

To adequately shield the peripheral card against radiating or receiving EMI, the shield must have a low enough resistivity so that no electro-magnetic energy can penetrate. Therefore, the shield must have a combination of adequate thickness and conductivity. For example, a relatively thin continuous metal shield can provide adequate shielding at all frequencies. A polymer filled with conductive material, hereinafter referred to as filled polymer, on the other hand is likely to provide poor shielding at particular frequencies. Furthermore, the shield needs to provide a continuous conductive surface area to ensure uninterrupted surface current flow. Any discontinuities in the shield leads to what is called a slot antenna, through which EMI can penetrate.

A number of packaging techniques are available in constructing peripheral cards such as PCMCIA cards, some of which have been modified to provide limited protection against ESD and EMI.

One common packaging technique has been the use of sheet metal housing. FIG. 1 depicts a PCMCIA card constructed in accordance with this technique. A PC board 50 is electrically coupled to a female PCMCIA edge connector 51. The PC board 50 fits in a groove or shelf in a plastic rim 52 surrounding the PC board 50. Sheet metal jackets 53 are attached to the top and bottom of the assembly to form the complete PCMCIA card. Since the metal jackets 53 are usually fairly flexible, sheets of plastic insulators 55 are placed between the PC board 50 and the metal jackets 53. The plastic insulators 55 preclude the PC board 50 from coming into electrical contact with the metal jackets 53, thereby preventing electrical shorts.

ESD protection is provided by electrically coupling the metal jackets 53 to a ground trace on the PC board via conductive clips. The conductive clips are attached to ground pads on the PC board. These clips are raised from the PC board surface to make electrical contact with the metal jackets 53. Therefore, an electrostatic discharge path is provided from the metal jackets 53 to the ground circuit on the PC board via the conductive clips.

In protecting against EMI, the two metal jackets 53 provide adequate shielding in the surface area. However, where the two metal jackets 53 are butted together a slot antenna is formed through which EMI can penetrate. Several techniques have been used to ensure full electrical contact between the metal jackets 53 however, none have proven effective. Additional conductive clips are used to short the two halves of the case together to reduce the length of the slot antenna, thereby reducing the magnitude of the EMI problem.

The above packaging technique however, possesses a number of drawbacks. First, the manufacturing process must align and attach several parts: the PC board, the edge connector, the plastic rim, the conductive clips, the sheets of plastic insulators and the metal jackets. This multistage assembly process is time consuming and labor intensive and therefore quite costly. Second, the sheet metal jackets are generally fairly flexible implying a relatively weak external protective structure for the PC board. Third, the metal jackets do not fully protect against EMI since a perfect electrical contact may not be obtained between the two metal jackets, and the conductive clips will not fully eliminate EMI. Fourth, given the ease with which the metal jackets can be pried open, the ICs housed inside are easily accessible. This is of concern in applications such as security cards, where the ICs carry proprietary data.

Another method of packaging Peripheral cards is disclosed in the aforementioned patent document of Takiar et al., incorporated herein by reference. This method provides a solid one-piece injection molded package, housing the PC board. This method significantly simplifies the manufacturing process, thereby reducing the cost. Furthermore, the solid one-piece package provides a stronger external protective structure for the PC board as well as an added level of security for the ICs housed inside the card (i.e. the package can not easily be pried open).

Even though this method removes some of the drawbacks of the prior art, it however introduces others. This method requires the use of non-conductive molding material such as thermoset plastic, and such non-conductive housing renders the peripheral card and the ICs inside susceptible to both ESD and EMI.

From the above, there has been a need for a method of manufacturing peripheral cards such that the resulting card would have a solid housing replacing the several parts, while ESD and EMI protection are not compromised.

SUMMARY

In accordance with the present invention, a portable peripheral card, such as a PCMCIA card, having an overmolded housing package is disclosed which will overcome the drawbacks of the prior art.

In one aspect of the invention, the peripheral card comprises a printed circuit board (PC board) having an active region where one or more electronic components are mounted, and an outer peripheral region surrounding the active region. An edge connector is attached to the PC board to enable communication between external devices and the electronic components. A solid overmolded package is provided which encapsulates the printed circuit board and the electronic components, yet exposes a portion of the edge connector to facilitate electrical connections between external devices and the PC board.

The solid package is composed of a conductive segment and a non-conductive segment. The non-conductive segment encapsulates the active region of the PC board and the conductive segment encapsulates the outer periphery surrounding the active region. A conductive layer is secured to each of the top and bottom surfaces of the housing via conductive adhesive. Each conductive layer covers the entire surface area over the active region and extends over a portion of the outer periphery region.

In another aspect of the invention, conductive layers are provided to each of the top and bottom surfaces of the non-conductive material prior to molding of the conductive material thereon, so as to capture extensions of the conductive layers and secure them to the solid package.

The peripheral card as described above protects the PC board and the electronic components from damage caused by ESD, by providing an effective discharge path for electrostatic charge built up anywhere on the surface of the peripheral card. The discharge path is from the conductive layer to the conductive segment of the package via the conductive adhesive, and from the conductive segment to the ground terminal of the edge connector via a conductive trace on the PC board.

The peripheral card described above also provides effective shielding against electro-magnetic interference. The conductive layer provides shielding in the surface area while the conductive segments in conjunction with the ground trace provide shielding in the periphery area. Therefore, the PC board is surrounded by continuous conductive material, and thus is shielded against EMI.

One feature of this invention is that it provides an effective discharge path for electro-static charge build-up anywhere on the surface of the peripheral card.

Another feature of this invention is that it provides adequate shielding around the peripheral card against radiating or receiving EMI.

Yet another feature of this invention is that it provides a solid package for housing the PC board, thereby providing a strong protective structure for the PC board as well as protecting the ICs housed inside the peripheral card from being easily accessible.

Yet another feature of this invention is that the above features are achieved while minimizing the manufacturing cost of the peripheral cards.

Yet another feature of this invention is that the above features are achieved within the constraints set by the industry on the physical dimensions of the peripheral card as well as on its other aspects.

These and other features and advantages of the present invention will become more apparent from the following description and the accompanying drawings.

DETAILED DESCRIPTION OF THE PREFERRED EMBODIMENT

Figure 1:
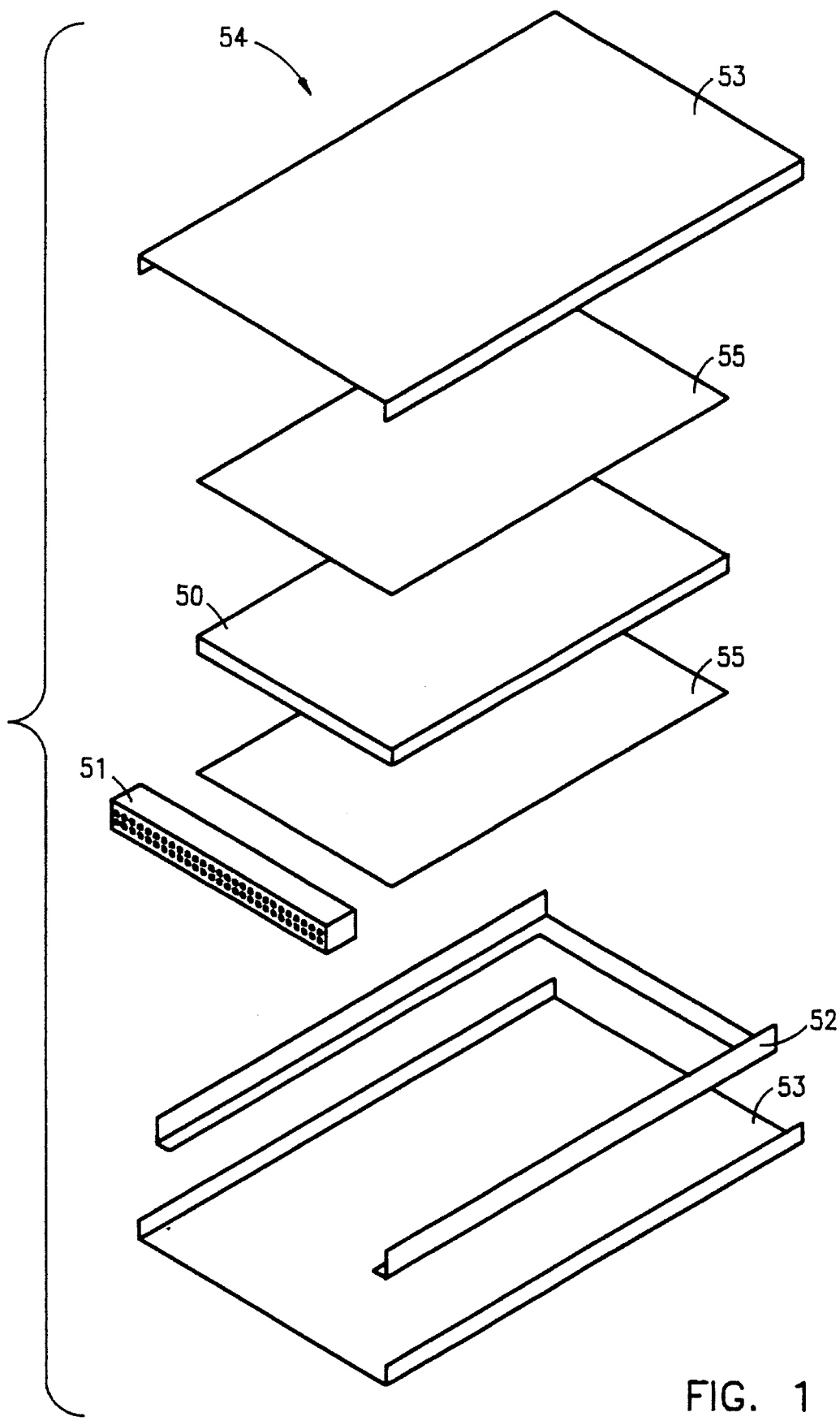
FIG. 1 is an exploded view of a conventional PCMCIA peripheral card.
Figure 2:
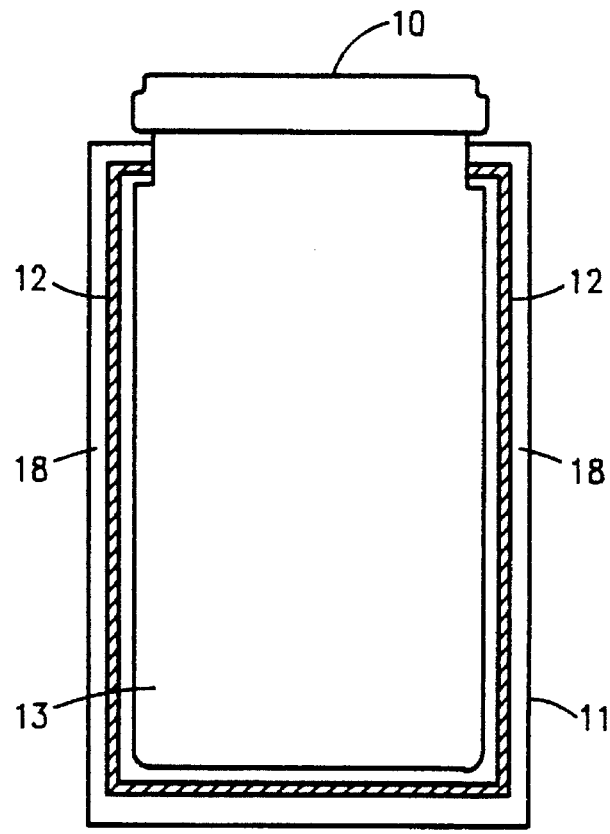
FIG. 2 is a plan view of a peripheral card made in accordance with the present invention, wherein the outer periphery of the PC board containing the ground trace is shown as being exposed.
Figure 3:
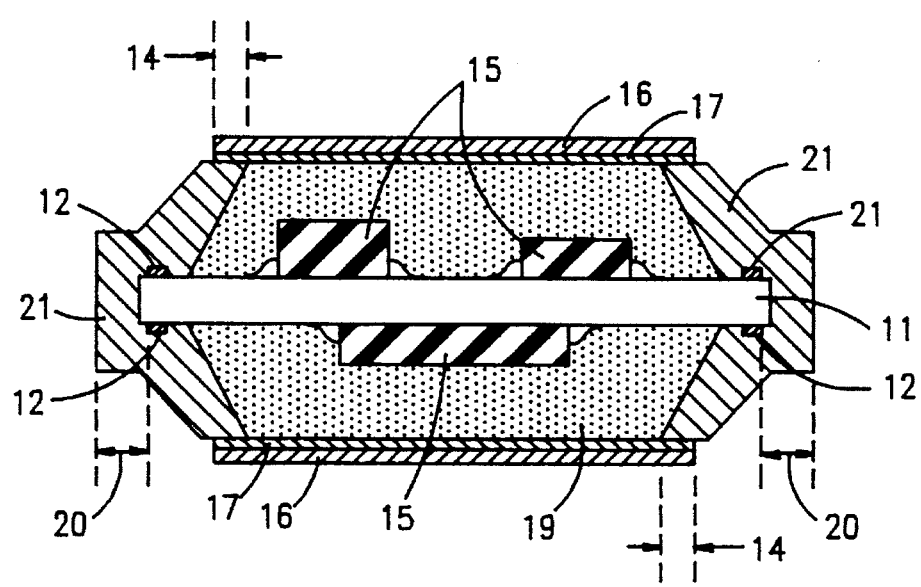
FIG. 3 is a sectional view of the peripheral card in accordance with the present invention.

A first embodiment according to the present invention is shown in FIGS. 2 and 3. As shown in FIG. 3, one or more electronic components 15 such as packaged integrated circuits, resistors and capacitors are mounted on a printed circuit board (PC board) 11. The area of the PC board 11 where the electronic components 15 are located will be referred to as the active regions, and is shown in FIG. 2 as regions 13. An edge connector 10 is electrically coupled to the PC board 11. The edge connector 10 provides the means through which external devices electrically access the electronic components 15. As shown in FIG. 2, a ground trace 12 travels around the outer perimeter 18 of the PC board 11 surrounding the active regions 13. In FIG. 3 the ground trace 12 is shown as being raised from the PC board surface for pictorial clarity, where in reality it is embedded in the PC board 11.

Through two consecutive molding processes the PC board 11 is completely encapsulated with packaging material while leaving a portion of the electrical connector 10 exposed. For the first molding process, a single cavity molding tool is developed which encapsulates only the active regions 13 of the PC board 11, leaving the outer perimeter 18 exposed. The first molding process is carried out by first positioning the PC board 11 in the mold, and subsequently injecting a non-conductive packaging material into the mold, encapsulating the active regions 13 of the PC board 11. As a result, non-conductive regions 19 are formed over the active regions 13. The non-conductive packaging material used is preferably thermoset plastic material, although other suitable non-conductive material may be used.

To carry out the second molding process, another single cavity molding tool is developed for encapsulating only the exposed outer perimeter 18 of the PC board 11. As in the first molding process, the PC board 11 is positioned in the second mold, however, a conductive packaging material is injected into the mold to encapsulate the outer perimeter 18. As a result, conductive region 21 is formed, encapsulating the outer perimeter 18. The conductive packaging material used is preferably thermoplastic material, however other suitable conductive material may be used.

In the two molding processes, when the packaging material is being injected into the mold, precautions need to be taken in preventing the packaging material from entering the openings of the female edge connector 10. Many prevention methods are available including plugging the openings from inside with suitable sealant material.

In each of the two molding processes, in order to form a solid housing, after the injection step the packaging material may require curing depending on the material used. This curing step may merely include allowing the packaging material to sit in the mold until the material hardens, or it may include a sequence of steps of actively heating or cooling the packaging material. For thermoset plastic material the curing step is automatic because of the characteristic of the chemical properties of thermoset plastic. For thermoplastic material however, it is generally advantageous to cool thermoplastic to hasten its solidification.

After the curing step (if required), a thin layer of metallic material 16, hereinafter referred to as a conductive label 16, is secured to each of the top and bottom surfaces of the peripheral card via conductive adhesive material 17. The adhesive material used is preferably from Z-axis adhesive material, although other suitable adhesive material may be used. Also, methods other than use of adhesive material are available for securing the conductive label.

The extent of the surface area covered by the conductive labels 16 is an important factor in achieving the objects of the invention. As shown in FIG. 3, the conductive labels 16 not only cover the entire surface area over the non-conductive regions 19 but extend across and overlap a portion of the area over the conductive region 21. This overlap area is marked as 14 in FIG. 3.

The significance of such surface coverage by the conductive label is twofold. First, with regions 19 covered by the conductive labels 16, the electronic components 15 are completely shielded against any Electro-magnetic interference through the top or bottom surface area. Second, with the conductive labels 16 overlapping the surface area 14, electrical contact is made between the conductive labels 16 and the conductive region 21 through the conductive adhesive 17. This electrical path is part of the discharge path for electro-static charge built up anywhere on the surface area.

Any electro-static charge build-up on the surface of the card is discharged through the following path: from the conductive labels 16 to the conductive region 21 via the conductive adhesive 17, and from the conductive region 21 to the ground terminals of the edge connector via the ground trace 12.

The ground trace 12 serves an important purpose in providing adequate protection against both ESD and EMI. The conductive material (region 21) covering the outer perimeter of the card is a filled polymer which, as discussed earlier, is a poor conductor at particular frequencies.

In the absence of the ground trace 12, ESD poses a problem in cases where electro-static charge is built up at the end of the card opposite the edge connector, without the ground trace, the discharge path would be through the relatively resistive region 21, across the length of the PC card 11 to the ground terminal of the edge connector 10. This path will not provide for an effective discharge of the build-up charges, resulting in possible damage to the PC board 11 or the device to which the card is coupled. With the ground trace 12 present, the maximum distance the charge would travel in region 21 is the distance 20 shown in FIG. 3. Since the ground trace is highly conductive, the length of the resistive path through region 21 is reduced to that shown by distance 20.

As discussed earlier, for effective shielding the shield must have low enough resistivity such that no electromagnetic energy can penetrate. In the absence of the ground trace 12, region 21 would not provide adequate shielding at all frequencies. The ground trace 12 embedded in region 21, improves the conductivity of this region by providing a highly conductive parallel path to that of region 21, thereby improving the shielding characteristics of this region against EMI.

Another aspect of this invention relates to the molding tools used in the molding process. An important goal in any molding process is to ensure a balanced mold flow around the PC board. To achieve this goal, the molding tool is typically designed such that it holds the PC board firmly in place while the packaging material is injected into the mold. The prior art molding tool accomplishes this task by clamping down on the active regions 13 of the PC board. This method however, places a severe limitation on the board designers' ability to implement any layout changes on the PC board once the molding tool is developed. This is due to the prohibitively high redevelopment cost of a molding tool required when the layout of the active regions 13 is changed.

The above limitation is eliminated by the molding process of the present invention. The first molding tool is designed such that it clamps the outer perimeter 18 of the PC board 11. The outer perimeter 18 contains only the ground trace 12, which is unaffected by any layout changes in the active regions 13 of the PC board 11. Once the active regions 13 are overmolded, forming regions 19, the second molding tool clamps on the overmolded regions 19. Therefore, neither of the two molding tools engage any sections of the active regions 13 of the PC board 11. Thus, the board designer is able to implement changes to the PC board 11 even after the molding tools have been developed without requiring the costly step of redeveloping a new molding tool.

Furthermore, the molding tool development can be carried out simultaneously with the design of the PC board since the two operations are made independent. This parallel operation results in shorter product development and revision cycles.

In a second embodiment of the present invention, the conductive material of region 21 is from metal which may either be pre-fabricated or overmolded. Where the metal is overmolded, the packaging process is similar to that of the first embodiment. Where the metal is pre-fabricated, the pre-fabricated X is clipped on to the PC board 11 prior to overmolding the active regions 13 of the PC board 11. The active regions 13 can be overmolded with similar material and in a similar manner to that of the first embodiment. The molding tool for overmolding the active regions 13 is designed such that it clamps the pre-fabricated metal while the packaging material is injected into the mold. Here again the freedom to change the board layout after the molding tool has been developed is preserved.

As in the first embodiment, a conductive label is secured to the top and bottom surfaces of the peripheral card. The combination of the conductive label and the metal periphery, provide for complete protection against ESD and EMI. In this embodiment the metal trace is no longer needed.

Another advantage of this embodiment is the elimination of the second molding tool and the corresponding molding steps, thereby reducing cost and the manufacturing time cycle. Furthermore, the metal periphery better protects against physical damage as compared to polymer material such as thermoplastic or thermoset, and provides a more ideal EMI shield in region 21.

Figure 4:
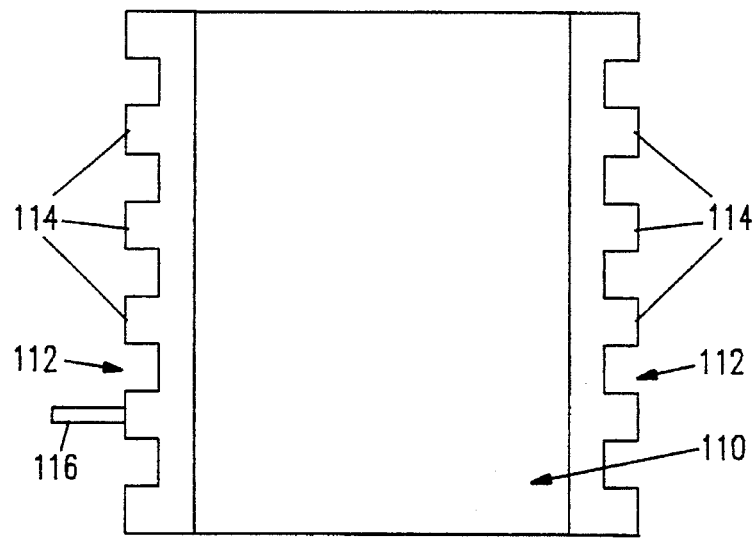
FIG. 4 is a plan view of a lid for application to another embodiment of the invention.
Figure 5:
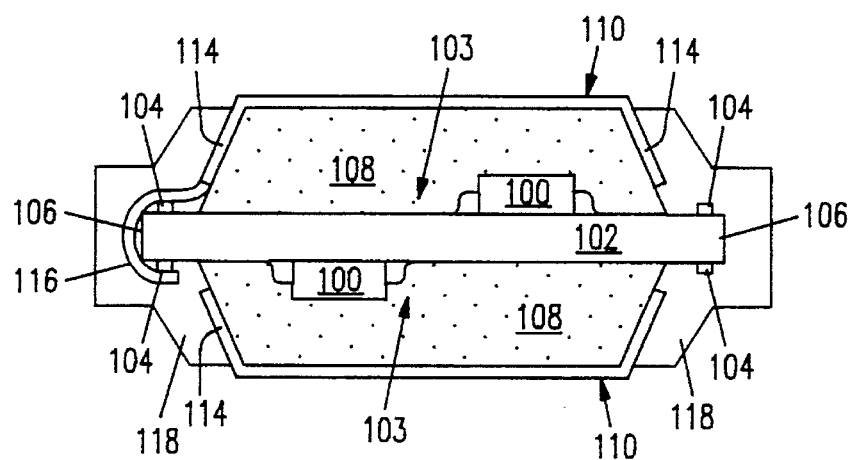
FIG. 5 is a sectional view of another embodiment of peripheral card in accordance with the present invention.
Figure 6:
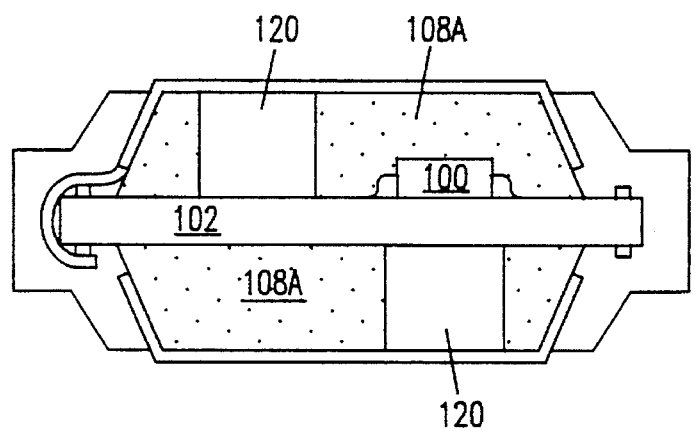
FIG. 6 is a sectional view of yet another embodiment of the peripheral card in accordance with the present invention.

Reference is made to FIGS. 4–6 showing additional embodiments of the invention.

Similar to the embodiment of FIGS. 2 and 3, electronic components 100 such as packaged integrated circuits, resistors and capacitors are mounted on a printed circuit board (PC board) 102, defining active regions 103. A ground trace 104 travels around the outer perimeter 106 of the PC board 102 surrounding the active regions 103. Again, for the first molding process, a single cavity molding tool is used to encapsulate only the active regions 103 of the PC board 102, leaving the outer perimeter 106 exposed. The first molding process is carried out by positioning the PC board 102 in the mold, and subsequently injecting a non-conductive packaging material 108 into the mold, encapsulating the active regions 103 of the PC board 102. The non-conductive packaging material 108 used is preferably thermoset plastic material, although other suitable non-conductive material may be used.

At this point, conductive metal lids 110 are placed on the top and bottom surfaces of the non-conductive material 108. Each lid 110 is prebent to conform to the shape of the formed non-conductive material 108, to lie in close conformance therewith. Also, as shown, each lid 110 has opposite edges 112 which define extensions 114 therealong, and which extend toward the printed circuit board 102 with the lid 110 in place over the non-conductive material 108. To aid in the positioning of the lids 110, a tab 116 extends therefrom to surround an edge of the printed circuit board 102.

Then, a second molding process is undertaken. In furtherance thereof, another single cavity molding tool is developed for encapsulating only the exposed outer perimeter 106 of the PC board 104. As in the first molding process, the PC board 104 is positioned in the second mold, however, conductive packaging material 118 is injected into the mold to encapsulate the outer perimeter 106. As a result, conductive segment is formed, encapsulating the outer perimeter. The conductive packaging material 118 is preferably thermoplastic material, however, other suitable conductive material may be used.

During this second molding operation, the extensions 114 of the lids 110 are captured between the non-conductive packaging material 108 and the conductive packaging material 118, so as to be embedded into the resulting package made up of conductive and non-conductive material.

It will be noted that in this embodiment, a lid 110 may act as the conductive label, and it is not necessary to use adhesive material as previously described.

Similar to the previous embodiments, the electronic components are completely shielded against any electromagnetic interference through the top or bottom surface area. Furthermore, electrical contact is made between the lids 110 and the conductive material 118. This electrical path is part of a discharge path for electrostatic charge buildup anywhere on the surface area.

In the situation where an item such as a battery becomes part of the package, reference is made to FIG. 6 showing an additional feature of the invention.

Typically, such a battery, having a flexible package containing a gel-like substance, may be placed on the printed circuit board prior to injection molding of the non-conductive material. In such case, pressure of the injection molding, to which the battery is exposed, may cause the battery package to burst. To avoid this problem, during molding of the non-conductive material 108A, cavities or voids 120 are formed in the non-conductive material 108A so as to be defined thereby. Then, prior to the placement of the lids 110, the battery is placed in a cavity 120. Thus, the problem of applying possibly excessive pressure to the battery during injection molding is avoided.

An advantage associated with the above embodiments is that in using a thin metal layer as the conductive label, the ESD and EMI concerns are addressed while the thickness of the peripheral card is kept within the thickness requirements prescribed by industry standards.

Furthermore, the packaging techniques of the above embodiments, lend themselves well to the chip-on-board (COB) and multi-chip module technologies. The non-conductive material provides the protective layer normally required for the die and wirebonds in COB technology.

The above description of embodiments of this invention is intended to be illustrative and not limiting. The invention is further intended to include all variations and modifications falling within the scope of the appended claims.

We claim:

1. A portable peripheral card comprising:
    a printed circuit board (PC board) having an active region where one or more electrical components are mounted;
    an electrical connector attached to the PC board, whereby external devices electrically access said one or more electronic components via said electrical connector;
    a solid package encapsulating the PC board yet leaving a portion of said electrical connector exposed, said solid package being composed of a conductive segment and a non-conductive segment;
    a conductive layer overlying a portion of said package and including a plurality of extensions extending into said package and in contact with the conductive segment of the package.

2. A portable peripheral card as recited in claim 1 wherein said non-conductive segment encapsulates said active region of the PC board, and said conductive segment encapsulates a remaining outer perimeter of the PC board surrounding said active region.

3. A portable peripheral card as recited in claim 1 wherein said conductive segment is metal and said non-conductive segment is polymer.

4. A portable peripheral card as recited in claim 3 wherein said polymer is thermoset plastic material.

5. A portable peripheral card as recited in claim 3 wherein said metal is pre-fabricated and is clamped to the PC board.

6. A portable peripheral card as recited in claim 1 wherein said conductive segment is filled polymer and said non-conductive segment is polymer.

7. A portable peripheral card as recited in claim 1 wherein said conductive segment is thermoplastic material and said non-conductive segment is thermoset plastic material.

8. A portable peripheral card as recited in claim 6 wherein a conductive trace travels around said outer perimeter of the PC board and electrically contacts said electrical connector.

9. A portable peripheral card as recited in claim 8 wherein said conductive trace is a ground trace.

10. A portable peripheral card as recited in claim 1 wherein said conductive layer is secured to said solid package via a conductive adhesive.

11. A portable peripheral card as recited in claim 10 wherein said conductive adhesive is z-axis adhesive.

12. A portable peripheral card as recited in claim 1 wherein said peripheral card is a PCMCIA card.

13. The portable peripheral card of claim 1 wherein the conductive layer is metal.

14. The portable peripheral card of claim 1 wherein the non-conductive segment of the package defines at least one cavity therein.

* * * * *